United States Patent
Muenz (10) Patent No.: US 10,678,033 B2
(45) Date of Patent: Jun. 9, 2020

(54) ZOOM SYSTEM WITH INTERCHANGEABLE OPTICAL ELEMENTS

(71) Applicant: Carl Zeiss SMT GmbH, Oberkochen (DE)

(72) Inventor: Holger Muenz, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 248 days.

(21) Appl. No.: 15/630,077

(22) Filed: Jun. 22, 2017

(65) Prior Publication Data

US 2017/0285311 A1  Oct. 5, 2017

Related U.S. Application Data

(63) Continuation of application No. PCT/EP2016/056370, filed on Mar. 23, 2016.

(30) Foreign Application Priority Data

Mar. 23, 2015  (DE) .................. 10 2015 104 323

(51) Int. Cl.
  *G02B 15/04* (2006.01)
  *G03F 7/20* (2006.01)
  *G02B 17/06* (2006.01)

(52) U.S. Cl.
  CPC .......... *G02B 15/04* (2013.01); *G02B 17/0615* (2013.01); *G02B 17/0694* (2013.01); *G03F 7/70191* (2013.01)

(58) Field of Classification Search
  CPC ............... G02B 15/04; G02B 17/0615; G02B 17/0694; G03F 7/70191
  (Continued)

(56) References Cited

U.S. PATENT DOCUMENTS 3,811,749 A    5/1974  Abel
4,469,396 A *  9/1984  Neil .................. G02B 13/18
                                                    359/353
(Continued)

FOREIGN PATENT DOCUMENTS

EP      1 141 760 A1    10/2001
EP      1471389 B1       7/2008
(Continued)

OTHER PUBLICATIONS

International Search Report and Written Opinion for corresponding Appl No. PCT/EP2016/056370, dated Jun. 9, 2016 (12 pages).
(Continued)

*Primary Examiner* — George G King
(74) *Attorney, Agent, or Firm* — Fish & Richardson P.C.

(57) ABSTRACT

A method for adjusting the magnification scale of an optical imaging device for exposing or inspecting substrates is provided. The optical imaging device includes a first optical element group, which includes a plurality of first optical elements in an imaging beam path. The method includes replacing optical elements of the first optical element group in the imaging beam path by optical elements of a second optical element group for the purposes of adjusting the magnification scale. The first optical element group includes two reflecting optical elements with first optical parameters, which define a first Petzval sum. The second optical element group includes two reflecting optical elements with second optical parameters, which define a second Petzval sum. The value of the first Petzval sum is at least substantially identical to the value of the second Petzval sum.

22 Claims, 3 Drawing Sheets

(58) Field of Classification Search
USPC .................. 359/380, 726–737, 672–675
See application file for complete search history.

(56) References Cited

U.S. PATENT DOCUMENTS

| | | | |
|---|---|---|---|
| 4,812,028 A * | 3/1989 | Matsumoto | G02B 17/0828 |
| | | | 359/366 |
| 4,964,706 A | 10/1990 | Cook | |
| 5,009,494 A | 4/1991 | Ioosi et al. | |
| 5,031,976 A | 7/1991 | Shafer | |
| 5,144,476 A | 9/1992 | Kebo | |
| 5,528,416 A * | 6/1996 | Hartmann | G02B 15/04 |
| | | | 359/381 |
| 5,712,720 A * | 1/1998 | Peng | G02B 15/04 |
| | | | 355/55 |
| 5,717,518 A | 2/1998 | Shafer et al. | |
| 7,136,159 B2 | 11/2006 | Tsai et al. | |
| 7,338,439 B2 | 3/2008 | Kanai | |
| 2002/0024741 A1* | 2/2002 | Terasawa | G02B 13/143 |
| | | | 359/627 |
| 2004/0027688 A1 | 2/2004 | Lange | |
| 2005/0190435 A1 | 9/2005 | Shafer et al. | |
| 2011/0164232 A1* | 7/2011 | Freimann | G03F 7/70258 |
| | | | 355/67 |
| 2011/0222164 A1* | 9/2011 | Seo | G02B 15/04 |
| | | | 359/672 |
| 2013/0155399 A9 | 6/2013 | Hwang et al. | |
| 2013/0321935 A1 | 12/2013 | Stites | |

FOREIGN PATENT DOCUMENTS

| | | |
|---|---|---|
| JP | S59-121019 A | 7/1984 |
| JP | 2014-145869 | 8/2014 |
| TW | 201037349 | 10/2010 |
| TW | 201348739 A | 12/2013 |
| WO | WO 00/41024 | 7/2000 |

OTHER PUBLICATIONS

German Office Action, with translation thereof, for corresponding DE Appl No. 10 2015 104 323.8, dated Nov. 17, 2015.
International Preliminary Report on Patentability for corresponding Appl No. PCT/EP2016/056370, dated Oct. 5, 2017.
Notice of Examination from Taiwan Intellectual Propriety Office, Taiwanese Application No. 105108947, dated Sep. 3, 2019.

* cited by examiner

ZOOM SYSTEM WITH INTERCHANGEABLE OPTICAL ELEMENTS

CROSS-REFERENCE TO RELATED APPLICATIONS

The present application is a continuation of, and claims benefit under 35 USC 120 to, international application PCT/EP2016/056370, filed Mar. 23, 2016, which claims benefit under 35 USC 119 of German Application No. 10 2015 104 323.8, filed Mar. 23, 2015. The entire disclosure of these applications are incorporated by reference herein.

FIELD

The present disclosure relates to a method and an imaging unit for adjusting the magnification scale of an optical imaging device. The disclosure can be applied in conjunction with any optical devices or optical imaging methods. In particular, it can be used in conjunction with the exposure or inspection of substrates, which preferably takes place at a wavelength of less than 200 nm. The disclosure can be used particularly advantageously in conjunction with the inspection of any surface or body. Thus, it can be used, in particular, in conjunction with the inspection of microelectronic circuits or the components used for the production thereof, in particular of masks or the like.

BACKGROUND

In many technical fields, in particular in the field of microlithography, it is desirable, inter alia, to subject bodies and the surfaces thereof to a detailed optical inspection in order, for example, to be able to assess the quality of a production process and, where desired, to be able to intervene in a correcting manner to the extent that the inspection determines that predetermined quality criteria are not satisfied. Naturally, the same, if not even higher desired performance properties are to be placed in this case on the precision of the imaging device used for the inspection in comparison with the devices used in the production process of the body to be inspected.

In this context, the capability of the imaging device, used for the inspection, of being able to process light with different wavelengths with aberrations that are as small as possible is of particular importance in order to ensure a broad field of application of the imaging device. Therefore, it is desirable or advantageous, in particular in the context of production methods which include an optical process, if the imaging device used for the inspection is able to process with minimized aberrations the wavelength range which is also used during the optical process. By way of example, this relates to the wavelength range from 193 nm (so-called VUV range) to 436 nm (so-called Hg g-line).

Only few optical materials have a sufficient transparency in this wavelength range, and so the systems are predominantly constructed from synthetic fused silica ($SiO_2$) and fluorite ($CaF_2$).

In this case, the chromatic aberrations, i.e. the aberrations dependent on the wavelength of the light, are problematic. By way of example, if an imaging device with refractive optical elements (such as lens elements or the like) is used for the inspection, the aberrations of the imaging device are generally only minimized with justifiable outlay for a comparatively narrow wavelength range. So-called achromatization of such a dioptric imaging device, i.e. an imaging device including only refractive optical elements, i.e. an elimination of such chromatic aberrations is hardly possible with justifiable outlay over a broadband wavelength range (such as the one specified above).

Therefore, use is often made of so-called catadioptric imaging devices, which, in addition to refractive optical elements, also include reflective optical elements, which are advantageous in view of chromatic aberrations. By way of example, such catadioptric systems are known from U.S. Pat. No. 5,031,976 (Shafer), U.S. Pat. No. 5,717,518 (Shafer et al.), U.S. Pat. No. 7,136,159 B2 (Tsai et al.) and US 2004/0027688 A1 (Lange), the complete disclosures of which are respectively incorporated herein by reference. Here, US 2004/0027688 A1 (Lange), inter alia, discloses a high aperture (numerical aperture NA greater than 0.90), strongly magnifying catadioptric microscope objective in the context of wafer inspection, to which a zoom system, i.e. an optical system with a variable magnification or focal length, is connected.

In general, optical systems with refractive elements can no longer be used economically for applications with a very broad wavelength range and/or very short wavelengths (typically less than 190 nm). In this case, such an optical system corrected over a broad bandwidth is typically constructed from mirrors only, i.e. it has a catoptric design, as it is known, for example, from U.S. Pat. No. 3,811,749 (Abel), the entire disclosure of which is included herein by reference.

If an optical system corrected over a broad bandwidth is intended to be realized with a zoom system, the zoom system should naturally also have a catoptric design in that case. Such a catoptric zoom system is known from, for example, U.S. Pat. No. 4,812,030 (Pinson), the entire disclosure of which is included herein by reference. Here, a single mirror is displaced in order to change the focal length of the overall system, wherein, however, the image plane is also correspondingly co-displaced. A similar effect can also be achieved by interchanging a mirror, as is known, for example, from U.S. Pat. No. 4,964,706 (Cook), the entire disclosure of which is included herein by reference. However, the image plane is displaced with the change in the overall focal length in this case too. However, such a displacement of the image plane is often undesirable, as it makes the overall system more complicated or more expensive.

Since the angles of incidence on the mirrors also change during zooming, the movement of three mirrors is generally advantageous for a sufficiently good imaging quality in the case of a fixed position of the image plane. Such a catoptric zoom system with a fixed position of the image plane is known from, for example, U.S. Pat. No. 5,144,476 (Kebo), the entire disclosure of which is included herein by reference. Here, three of the four mirrors are displaced in order to keep the image plane stationary. However, the position of the beam incident in the zoom system is not constant in this case, which makes the use of this zoom system as a partial system of a larger overall system more difficult.

Finally, in a generic zoom system, it is also possible to interchange a plurality of mirrors in order to realize different magnifications in the case of a fixed position of the image plane, as is known, for example, from U.S. Pat. No. 5,009,494 (Iossi et al.), the entire disclosure of which is included herein by reference. There, the entire optical unit of the zoom system consisting of three mirrors is interchanged in order to vary the magnification of the imaging. However, the position of the beam incident in the zoom system is, in turn, not constant here either, which also makes the use of this zoom system as a partial system of a larger overall system more difficult.

SUMMARY

The present disclosure seeks to provide a method and an imaging unit for adjusting the magnification scale of an optical imaging device, which do not have the aforementioned disadvantages or at least have the aforementioned disadvantages to a smaller extent, and, in particular, which enable imaging, which is corrected over a broad bandwidth, in a simple manner and with a simple integration into a larger optical overall system.

The present disclosure is based on the deliberation that imaging, which is corrected over a broad bandwidth, is possible in a simple manner and with a simple integration into a larger optical overall system if in each case a pair of reflecting optical elements, the optical parameters of which are different in order to realize the adjustment of the magnification scale but the Petzval sums of which are however at least substantially identical, are used for the two optical element groups which are interchanged with one another for adjusting the magnification scale.

As a result of the value of the first Petzval sum (of the first optical element group) being at least substantially identical to the value of the second Petzval sum (of the second optical element group), it is possible via a few optical elements to advantageously achieve a system, in which, in addition to a broadband correction, firstly, the beam positions on the entrance side and the exit side of the respective optical element group (prior to and after the interchange) remain at least substantially unchanged. Moreover, what can also be achieved herewith is that the pupil position and image field curvature (prior to and after the interchange) remain at least substantially the same. This enables a particularly simple integration of the zoom system, which is corrected over a broad bandwidth (in respect of the aberrations), into a larger optical overall system.

Therefore, in accordance with a first aspect, the present disclosure relates to a method for adjusting the magnification scale of an optical imaging device for exposing or inspecting substrates, in particular at a wavelength of less than 200 nm, including a first optical element group, which includes a plurality of first optical elements, which are arranged in an imaging beam path, in which the optical elements of the first optical element group are replaced in the imaging beam path by optical elements of a second optical element group for the purposes of adjusting the magnification scale. Here, the first optical element group includes two reflecting optical elements with first optical parameters, which define a first Petzval sum, while the second optical element group includes two reflecting optical elements with second optical parameters, which define a second Petzval sum, wherein the value of the first Petzval sum is at least substantially identical to the value of the second Petzval sum.

It should be mentioned once again at this point that the first optical parameters and the second optical parameters, from which the respective Petzval sum is established, differ from one another in a pairwise manner in order to realize the adjustment of the magnification scale. Consequently, a different value of the optical parameter is selected for an optical element of the first optical element group than for the corresponding optical element of the second optical element group (which replaces this optical element of the first optical element group). Therefore, only the Petzval sums determined from the pairwise different values of the optical parameter are at least substantially identical.

In principle, any suitable optical element groups which satisfy the condition of substantially identical Petzval sums can be used for the two optical element groups. Preferably, an afocal optical element system is used for the first optical element group and/or for the second optical element group, since this renders a particularly simple integration in a larger optical overall system possible.

Additionally or alternatively, an anastigmatic optical element system and/or an aplanatic optical element system is preferably used for the first optical element group and/or for the second optical element group. Both respectively lead to a zoom system corrected particularly well over a broad bandwidth in respect of the corresponding aberrations.

In preferred variants, two optical elements with at least substantially confocal and at least substantially paraboloid optical surfaces are used as the two optical elements of the first optical element group. Here, the optical surfaces of the first optical element group lie on paraboloid first surfaces arranged in a substantially coaxial manner. As a result of this, the properties and advantages described above can be realized in a particularly simple manner.

The regions of the optical surfaces of the first optical element group optically used during the imaging can be arranged in any suitable manner. Preferably, they are formed on segments which are offset transverse to the axes of the paraboloid first surfaces.

The possibly desired passages for the light in the imaging beam path can be realized in this case by cut-outs in the respective optical element. In the case of certain lightweight variants, the optical surfaces of the first optical element group can also be formed, however, on carrier segments which are offset transverse to the axes of the paraboloid first surfaces.

Additionally or alternatively, two optical elements with at least substantially confocal and at least substantially paraboloid optical surfaces are used as the two optical elements of the second optical element group. Here, the optical surfaces of the second optical element group lie on paraboloid second surfaces arranged in a substantially coaxial manner. Here too, the regions of the optical surfaces of the second optical element group used optically during the imaging are preferably formed on segments or carrier segments which are offset transverse to the axes of the paraboloid second surfaces.

It should be noted at this point that the optical surfaces of at least one of the optical elements of the first and/or second optical element group may possibly deviate slightly from an ideal paraboloid form. Firstly, such deviations may be caused by the obtainable manufacturing accuracy. However, predominantly, it is also possible to provide targeted deviations from an ideal paraboloid form, which serve to correct aberrations of the optical system. Thus, for example, defined waviness or the like may consequently be superimposed on the ideal paraboloid form in order to at least partly compensate for wavefront aberrations of the optical system.

In the case of specific variants with such paraboloid optical surfaces, a first primary element with a first primary element focal length $f_{11}$ and a first secondary element with a first secondary element focal length $f_{12}$ are used as the optical elements of the first optical element group, wherein the first optical element group defines a first magnification scale $M_1$, for which the following applies:

$$M_1 = \frac{f_{12}}{f_{11}}. \quad (1)$$

A second primary element with a second primary element focal length $f_{21}$ and a second secondary element with a second secondary element focal length $f_{22}$ are used as the optical elements of the second optical element group, wherein the second optical element group defines a second magnification scale $M_2$, for which the following applies:

$$M_2 = \frac{f_{22}}{f_{21}}. \quad (2)$$

For the first Petzval sum $P_1$ and the second Petzval sum $P_2$, the following applies for such pairs of paraboloid optical surfaces:

$$P_1 = \frac{1}{f_{11}} + \frac{1}{f_{12}} \quad (3)$$

and $$P_2 = \frac{1}{f_{21}} + \frac{1}{f_{22}} \quad (4)$$

With the condition of identical Petzval sums, i.e. with $$P_1 = P_2 \quad (5)$$

the following then furthermore applies:

$$f_{21} = f_{11} \cdot \frac{M_1 \cdot (M_2 + 1)}{M_2 \cdot (M_1 + 1)} \quad (6)$$

and $$f_{22} = f_{11} \cdot \frac{M_1 \cdot (M_2 + 1)}{(M_1 + 1)}, \quad (7)$$

such that, for example in the case of predetermined magnification scales $M_1$ and $M_2$ and a predetermined first primary element focal length $f_{11}$, the remaining parameters of the first and second optical element groups can easily be established.

In principle, any suitable optical parameters can be selected for the respective optical elements. A first primary element with a first primary element vertex radius of curvature $r_{11}$, which is 50 mm to 1500 mm, preferably 100 mm to 1000 mm, more preferably 200 mm to 800 mm, is preferably used as an optical element of the first optical element group. Additionally or alternatively, a first secondary element with a first secondary element vertex radius of curvature $r_{12}$, which is 50 mm to 1500 mm, preferably 100 mm to 1000 mm, more preferably 200 mm to 800 mm, is used as an optical element of the first optical element group. Additionally or alternatively, a second primary element with a second primary element vertex radius of curvature $r_{21}$, which is 50 mm to 1500 mm, preferably 100 mm to 1000 mm, more preferably 200 mm to 800 mm, is used as an optical element of the second optical element group. Finally, additionally or alternatively, a second secondary element with a second secondary element vertex radius of curvature $r_{22}$, which is 50 mm to 1500 mm, preferably 100 mm to 1000 mm, more preferably 200 mm to 800 mm, is used as an optical element of the second optical element group. Using these parameter values, it is possible to obtain particularly advantageous configurations in each case, in particular particularly compact configurations with an advantageous variation of the magnification scale.

In further preferred variants, an entrance pupil is defined on the light entrance side of the first optical element group and/or the second optical element group (for example by an image of a unit disposed upstream thereof in the beam path, for example a stop or the like disposed upstream thereof, or by a corresponding entrance pupil unit). A first primary element of the first optical element group is then preferably arranged in such a way in a first operating state that a vertex of the first primary element lies at a distance from the entrance pupil along an optical axis of the imaging device, which distance corresponds at least substantially to a first primary element focal length $f_{11}$ of the first primary element. Additionally or alternatively, a second primary element of the second optical element group is arranged in such a way in a second operating state that a vertex of the second primary element lies at a distance from the entrance pupil along an optical axis of the imaging device, which distance corresponds at least substantially to a second primary element focal length $f_{21}$ of the second primary element. The condition being satisfied for both primary elements is advantageous in that the exit pupil remains at least substantially unchanged in the case of an interchange.

In further variants, an entrance pupil is defined for an entrance light beam, in particular a collimated entrance light beam (for example by an image of a unit disposed upstream thereof in the beam path, for example a stop or the like disposed upstream thereof, or by a corresponding entrance pupil unit) on the light entrance side of the first optical element group and/or the second optical element group, which entrance light beam is associated with a first part of the optical axis of the imaging device, the part being incident on a primary element of the first optical element group and/or the second optical element group. An exit pupil for an exit light beam, in particular a collimated exit light beam is defined (possibly by an image of a unit disposed upstream thereof in the beam path, for example a stop or the like disposed upstream thereof, or by a corresponding exit pupil unit) on the light exit side of the first optical element group and/or the second optical element group, which exit light beam is associated with a second part of the optical axis of the imaging device, the part emanating from a secondary element of the first optical element group and/or the second optical element group. Then, the primary element and the associated secondary element are arranged transvers to the first part of the optical axis with a transverse offset in relation to one another in order to obtain a shadow-free imaging beam path in a simple manner.

In principle, the transverse offset can be selected to have any size, with it being selected to be as small as possible in the interest of a compact arrangement and good imaging quality, wherein, preferably, natural shadowing by components projecting into the beam path, in particular by the optical elements of the first and second optical element groups themselves, are at least avoided to the largest possible extent. Preferably, the transverse offset is selected in such a way that, prior to passing through the exit pupil, the portion of the imaging light beam passing through the entrance pupil passes by the entrance pupil and/or the exit pupil and/or the optical elements without overlap and/or without shadowing at a distance, which is less than 5% to 20%, preferably 1% to 15%, more preferably 1% to 10%, of a diameter of the entrance pupil or a maximum diameter of the entrance light beam. In particular, the transverse offset in configurations with a particularly compact design can be 50% to 250%, preferably 75% to 200%, more preferably 90% to 150%, of a smallest vertex radius of curvature of the optical elements.

In principle, the optical elements can have any design, in particular they can be provided with concave optical surfaces. An optical element with a concave optical surface is preferably used for at least one of the optical elements of the first optical element group, in particular for a primary element of the first optical element group, and/or for at least one of the optical elements of the second optical element group, in particular for a primary element of the second optical element group.

However, in certain variants, it is also possible, where desired, to use one or more convex optical surfaces (i.e. optical surfaces with negative refractive power). Therefore, additionally or alternatively, an optical element with a convex optical surface can be used for at least one of the optical elements of the first optical element group, in particular for a secondary element of the first optical element group, and/or for at least one of the optical elements of the second optical element group, in particular for a secondary element of the second optical element group. Particularly compact configurations can be obtained in this case, in particular in combination with an assigned concave optical surface.

In principle, the optical elements can be interchanged in any manner. Thus, for example, the respective optical element or element pair can be detached separately from a support structure, or assembled on the latter, in order to realize the interchange. Naturally, any actuator device or the like, which moves the respective optical element or element pair out of the imaging beam path or into the imaging beam path in a corresponding manner, is likewise realizable.

Preferably, the movement of individual elements to be interchanged, or of all elements to be interchanged, with one another is carried out together, possibly also simultaneously, since this allows a particularly simple and quick interchange or a particularly simple and quick adjustment of the magnification scale. Therefore, preferably, at least one of the optical elements of the first optical element group is moved together with at least one optical element of the second optical element group for the purposes of adjusting the magnification scale.

This movement can be an arbitrarily complex movement on any suitable trajectory. Preferably, a simple swiveling movement is realized as this allows a particularly simple and compact design to be realized.

In this case, it is possible, as a matter of principle, to use any number of different carrier components for the optical elements. However, at least one of the optical elements of the first optical element group is preferably arranged with at least one optical element of the second optical element group on a common carrier device. Particularly simple and robust designs emerge if all optical elements of the first and second optical element groups are arranged on a common carrier device.

In accordance with a further aspect, the present disclosure relates to an optical imaging method for exposing or inspecting substrates, in particular at a wavelength of less than 200 nm, in which an object is illuminated by way of an illumination device with an optical illumination element group and an image of the object on an image device is generated via a projection device with an optical projection element group. Here, a method according to the disclosure for adjusting a magnification scale when imaging the object is used in the projection device. Using this, the variants and advantages described above in the context of the method according to the disclosure can be realized to the same extent, and so reference is made to the explanations above in this respect.

In accordance with a further aspect, the present disclosure relates to an optical imaging unit for exposing or inspecting substrates, in particular at a wavelength of less than 200 nm, including a first optical element group and a support structure, wherein the first optical element group includes a plurality of first optical elements, which are arranged in an imaging beam path via the support structure. The support structure and the optical elements of the first optical element group are configured in such a way that, during normal operation of the imaging unit, the optical elements of the first optical element group are replaced in the imaging beam path by optical elements of a second optical element group for the purposes of adjusting a magnification scale of the imaging unit. Here, the first optical element group includes two reflecting optical elements with first optical parameters, which define a first Petzval sum, while the second optical element group includes two reflecting optical elements with second optical parameters, which define a second Petzval sum. The value of the first Petzval sum is at least substantially identical to the value of the second Petzval sum. Using this, the variants and advantages described above in the context of the method according to the disclosure can be realized to the same extent, and so reference is made to the explanations above in this respect.

Finally, the present disclosure relates to an optical imaging device for exposing or inspecting substrates, in particular at a wavelength of less than 200 nm, including an illumination device with an optical illumination element group, an object device for receiving an object, a projection device with an optical projection element group and an image device. Here, the illumination device is configured to illuminate the object (104.1), while the projection device is configured to project an image of the object onto the image device. The projection device includes an optical imaging unit according to the disclosure. Using this too, the variants and advantages described above in the context of the method according to the disclosure can be realized to the same extent, and so reference is made to the explanations above in this respect.

Further preferred embodiments of the disclosure emerge from the dependent claims and the following description of preferred exemplary embodiments, which refers to the attached drawings. Here, any combinations of the disclosed features are part of the subject matter of the disclosure, regardless of the mentioning thereof in the claims.

DETAILED DESCRIPTION

A preferred embodiment of an optical imaging device 101 according to the disclosure is described below with reference to FIGS. 1 to 4. In order to simplify the understanding of the following explanations, an orthogonal xyz-coordinate system was introduced into the attached drawings, in which the z-direction coincides with the direction of the gravitational force. However, it is understood that any other alignment of this xyz-coordinate system or of the components of the optical imaging device in space can also be selected in other variants of the disclosure.

Figure 1:
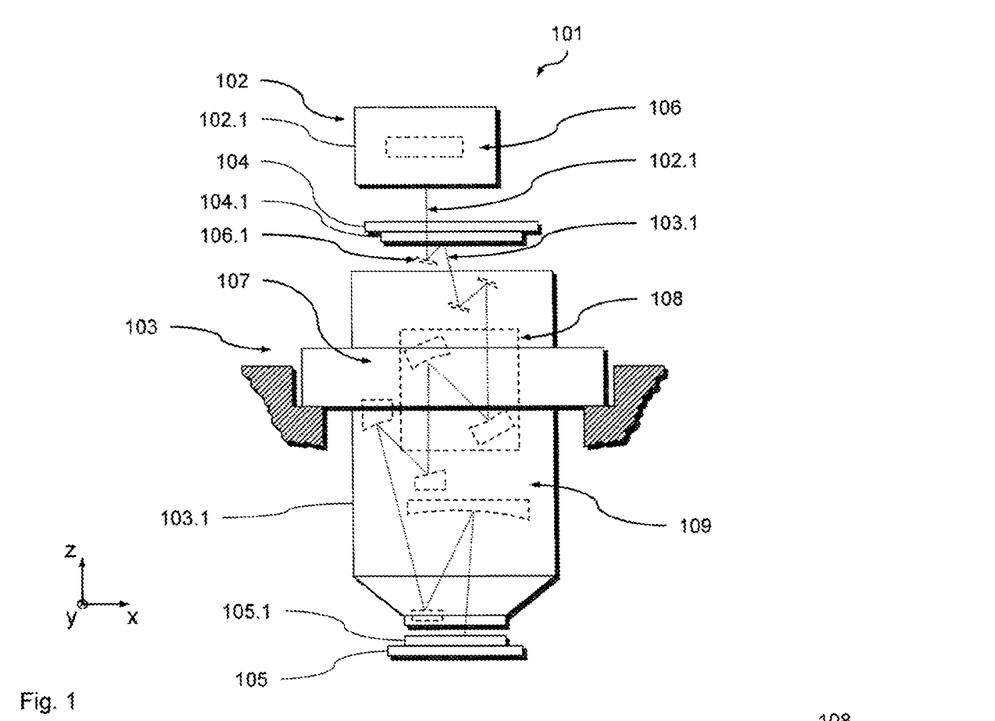
FIG. 1 is a schematic illustration of a preferred embodiment of an optical imaging device according to the disclosure, which includes a preferred embodiment of an optical imaging unit according to the disclosure, in which a preferred embodiment of an optical imaging method according to the disclosure with a preferred embodiment of the method according to the disclosure for adjusting the magnification scale of the optical imaging device is used.

FIG. 1 is a schematic illustration, not true to scale, of the optical imaging device in the form of an optical inspection device 101, which serves for the inspection of substrates such as wafers or masks, as are used in the context of producing microelectronic circuits. The imaging device 101 includes an illumination device 102 and an optical projection device 103, an object device 104 and an image device 105.

The projection device 103 is configured to project an image of a projection pattern on an object in the form of a mask 104.1, which is received in the object device 104, onto an image sensor 105.1 of the image device 105 during an imaging process. To this end, the illumination device 102 illuminates the mask 104.1 via an optical waveguide device 106.1 with an illumination light beam (which is indicated by the line 102.1 in FIG. 1). The projection device 103 then receives the projection light beam coming from the mask 104.1 (which is indicated by the line 103.1 in FIG. 1) and projects the image of the projection pattern of the mask 104.1 onto the image sensor 105.1.

The illumination device 102 includes a system of optical elements 106 (only depicted very schematically in FIG. 1), while the optical projection device 103 includes a further system of optical elements 107 with a plurality of optical modules 108, 109. The optical modules of the optical systems 106 and 107 are in this case arranged along a folded optical axis 101.1 of the imaging device 101. One of the optical modules of the projection device 103 is an optical imaging unit according to the disclosure in the form of a zoom unit 108, by which, as will still be explained in more detail below, it is possible to set the magnification scale of the projection device 103 by way of a method according to the disclosure.

In the shown example, the imaging device 101 operates with light in the UV range at a wavelength below 200 nm, namely between 5 nm and 180 nm, more precisely at a wavelength from approximately 120 nm to 180 nm, typically from 150 nm to 180 nm. Consequently, the optical elements in the illumination device 102 and the projection device 103 are designed exclusively as reflective optical elements. However, it is understood that any type of optical element (e.g. refractive, reflective or diffractive optical elements) can also be used, either individually or in any combination, in other variants of the disclosure that operate at different wavelengths. Furthermore, the illumination device 102 can also include, where desired, a further optical module according to the disclosure in the form of a further zoom device.

Figure 2:
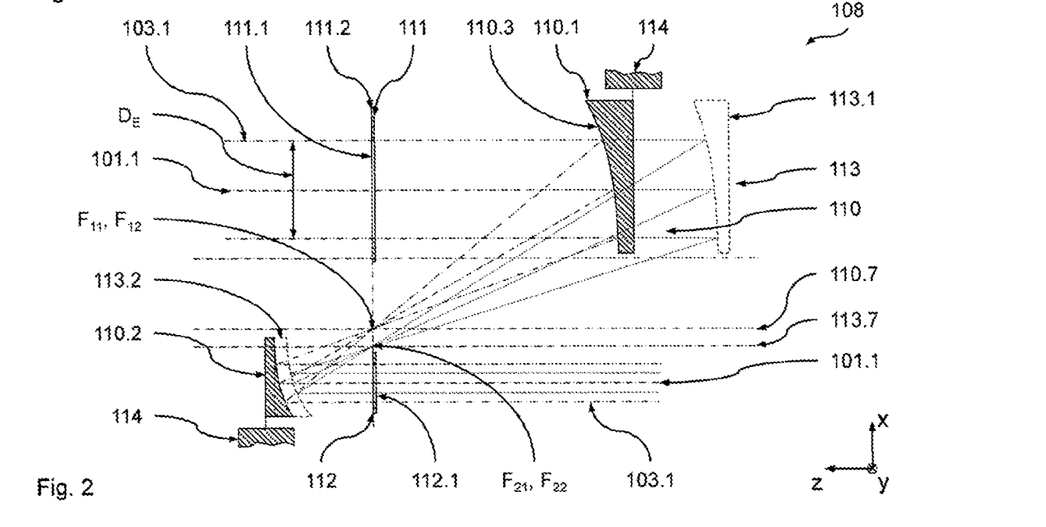
FIG. 2 is a schematic sectional view of the optical imaging unit according to the disclosure from FIG. 1.
Figure 3:
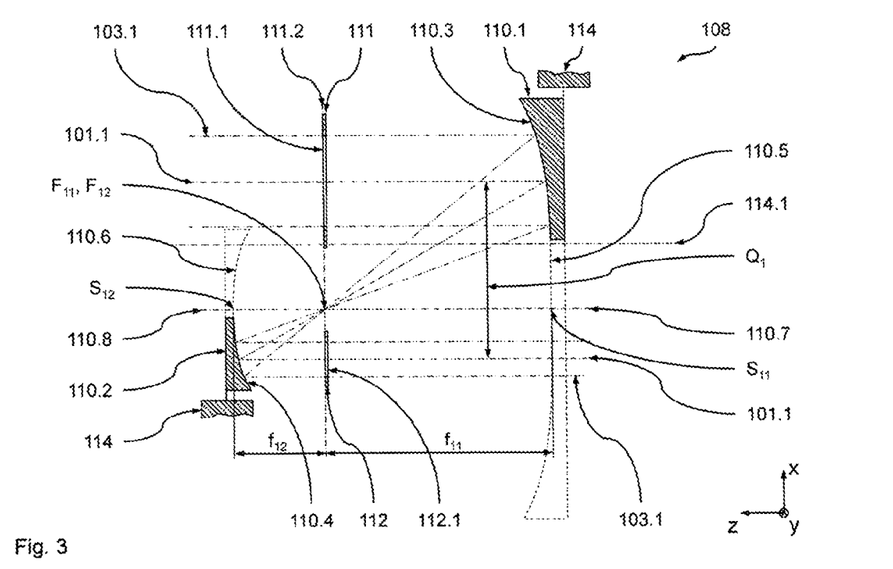
FIG. 3 is a schematic sectional view of part of the optical imaging unit according to the disclosure from FIG. 2 in a first operating state with a first magnification scale.

As can be gathered from FIGS. 2 and 3 in particular, the zoom unit 108 includes a first optical element group 110 with two first optical elements 110.1 and 110.2. The two first optical elements 110.1 and 110.2 of the first optical element group 110 are a first primary element in the form of a first primary mirror 110.1 and a first secondary element in the form of a first secondary mirror 110.2.

In a first operating state of the imaging device 101 which, in particular, is depicted in FIGS. 2 and 3, the first primary mirror 110.1, in the present example, guides the collimated projection light beam 103.1, which is incident on the primary side through an entrance pupil 111.1 of an entrance pupil unit 111, onto the first secondary mirror 110.2, which guides the light beam through an exit pupil 112.1 of an exit pupil unit 112 out of the zoom unit 108 again.

It is understood here that, in other variants of the disclosure, it is naturally also possible for the entrance pupil 111.1 and/or the exit pupil 112.1 not to be defined by such an entrance pupil unit 111 or by such an exit pupil unit 112, but by an image of a unit disposed upstream in the beam path of the first optical element group 110, for example a stop or the like disposed upstream thereof.

The first primary mirror 110.1 and the first secondary mirror 110.2 each have an at least substantially paraboloid optical surface 110.3 and 110.4, respectively, which are arranged in a confocal manner in relation to one another (i.e. the foci F11 and F12 thereof coincide). The optical surface 110.3 of the first primary mirror 110.1 in this case lies on a rotational paraboloid surface 110.5, while the optical surface 110.4 of the first secondary mirror 110.2 lies on a rotational paraboloid surface 110.6. The rotational paraboloid surfaces 110.5 and 110.6, and therefore also the optical surfaces 110.3 and 110.4, are arranged in a coaxial manner, i.e. the axes of rotation 110.7 and 110.8 thereof coincide.

By using such confocal and coaxial optical surfaces 110.3 and 110.4, an afocal optical element system emerges advantageously for the zoom unit 108, in which afocal optical element system a collimated projection light beam 103.1 emerges on the secondary-side exit (through the exit pupil 112.1) with the collimated projection light beam 103.1 at the primary-side entrance (through an entrance pupil 111.1). As a result of this, the zoom unit 108 can be optically integrated in a particularly simple manner into the overall system 107 of the projection device 103.

Furthermore, an anastigmatic and aplanatic optical element system can be realized by the first primary mirror 110.1 and the first secondary mirror 110.2, as a result of which, in the first operating state of the imaging device 101, a zoom unit 108 emerges, which is corrected particularly well and over a broad bandwidth in respect of the corresponding aberrations.

As can be gathered from FIG. 3, the first primary mirror 110.1 has a first primary element focal length $f_{11}$ while the first secondary mirror 110.2 has a first secondary element focal length $f_{12}$. As a result of this, a first magnification scale $M_1$ emerges for the first optical element group 110, with the following applying to the magnification scale in accordance with Equation (1):

$$M_1 = \frac{f_{12}}{f_{11}}.$$

In this case, the first optical element group 110 defines a contribution to the field curvature of the projection device 103 in the first operating state of the imaging device 101; consequently, it therefore defines a first Petzval sum $P_1$, for which the following applies in accordance with Equation (3):

$$P_1 = \frac{1}{f_{11}} + \frac{1}{f_{12}} = \frac{1}{R_1},$$

where $R_1$ is the radius of curvature which corresponds to this contribution to the field curvature of the imaging device 101 in the first operating state.

Figure 4:
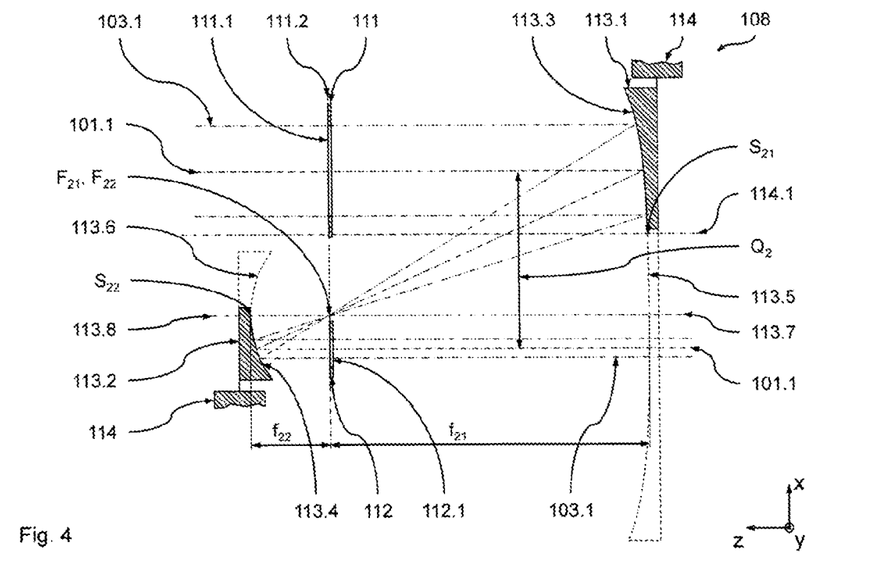
FIG. 4 is a schematic sectional view of part of the optical imaging unit according to the disclosure from FIG. 2 in a second operating state with a second magnification scale.

As can furthermore be gathered from FIGS. 2 and 4 in particular, the zoom unit 108 includes a second optical element group 113 (only indicated by a dashed contour in Figure) with two second optical elements 113.1 and 113.2. The two second optical elements 113.1 and 113.2 of the second optical element group 113 are a second primary element in the form of a second primary mirror 113.1 and a second secondary element in the form of a second secondary mirror 113.2.

In a second operating state of the imaging device 101, which is depicted in FIG. 4 and indicated in FIG. 2 by dashed contours 113, 113.1, 113.2, the first optical element group 110 has been interchanged with the second optical element group 113; i.e., the second optical element group 113 therefore replaces the first optical element group 110 in the imaging beam path of the projection light beam 103.1.

In the present example, in the second operating state, the second primary mirror 113.1 once again guides the collimated projection light beam 101.1, incident on the primary side through an entrance pupil 111.1, onto the second secondary mirror 113.2, which then guides the light beam out of the zoom unit 108 again through an exit pupil 112.1.

The second primary mirror 113.1 and the second secondary mirror 113.2 each likewise have an at least substantially paraboloid optical surface 113.3 and 113.4, respectively, which are arranged in a confocal manner in relation to one another (i.e. the foci F21 and F22 thereof coincide). The optical surface 113.3 of the second primary mirror 113.1 in this case lies on a rotational paraboloid surface 113.5, while the optical surface 113.4 of the second secondary mirror 113.2 lies on a rotational paraboloid surface 113.6. The rotational paraboloid surfaces 113.5 and 113.6, and therefore also the optical surfaces 113.3 and 113.4, are, once again, arranged in a coaxial manner, i.e. the axes of rotation 113.7 and 113.8 thereof coincide.

By using such confocal and coaxial optical surfaces 113.3 and 113.4, an afocal optical element system also emerges advantageously for the zoom unit 108 in the second operating state, in which afocal optical element system a collimated projection light beam 103.1 emerges on the secondary-side exit (through the exit pupil 112.1) with the collimated projection light beam 103.1 at the primary-side entrance (through an entrance pupil 111.1). As a result of this, overall, the zoom unit 108 can be optically integrated in a particularly simple manner into the overall system 107 of the projection device 103.

Furthermore, an anastigmatic and aplanatic optical element system can be realized in turn by the second primary mirror 113.1 and the second secondary mirror 113.2, as a result of which, in the second operating state of the imaging device 101 as well, a particularly good zoom unit 108 corrected over a broad bandwidth in respect of the corresponding aberrations emerges.

As can be gathered from FIG. 4, the second primary mirror 113.1 has a second primary element focal length $f_{21}$ while the second secondary mirror 113.2 has a second secondary element focal length $f_{22}$. As a result of this, a second magnification scale $M_2$ emerges for the second optical element group 113, with the following applying to the magnification scale in accordance with Equation (2):

$$M_2 = \frac{f_{22}}{f_{21}}.$$

In this case, the second optical element group 113 once again defines a contribution to the field curvature of the projection device 103 in the second operating state of the imaging device 101; consequently, it therefore defines a second Petzval sum $P_2$, for which the following applies in accordance with Equation (4):

$$P_2 = \frac{1}{f_{21}} + \frac{1}{f_{22}} = \frac{1}{R_2},$$

where $R_2$ then is the radius of curvature which corresponds to this contribution to the field curvature in the second operating state of the imaging device 101.

The simple neutral interchangeability of the afocal first optical element group 110 and the afocal second optical element group 113, and therefore the simple integration of the zoom unit 108 into the overall system 107 of the projection device 103, emerges in the present example by virtue of the optical parameters of the first optical element group 110 and of the second optical element group 113, i.e. the focal lengths ($f_{11}$, $f_{12}$, $f_{21}$, $f_{22}$) in the present case, being selected in such a way that the value of the first Petzval sum $P_1$ equals the value of the second Petzval sum $P_2$; consequently, the following applies in accordance with Equation (5):

Then, with this condition and predetermined magnification scales $M_1$ and $M_2$, the following furthermore emerges from Equations (3) and (4) for the optical parameters of the second optical element group 113 in accordance with Equation (6):

$$f_{21} = f_{11} \cdot \frac{M_1 \cdot (M_2 + 1)}{M_2 \cdot (M_1 + 1)}$$

and the following emerges in accordance with Equation (7):

$$f_{22} = f_{11} \cdot \frac{M_1 \cdot (M_2 + 1)}{(M_1 + 1)}.$$

Consequently, it is possible, for example with predetermined magnification scales $M_1$ and $M_2$ and a predetermined first primary element focal length $f_{11}$, to establish in a simple manner the remaining parameters of the first optical element group 110 and of the second optical element group 113.

In order to realize the adjustment of the magnification scale between the two operating states, i.e., consequently, to achieve that the following applies:

$$M_1 \neq M_2, \quad (8)$$

the first optical parameters (in this case the focal lengths $f_{11}$, $f_{12}$) and the second optical parameters (in this case the focal lengths $f_{21}$, $f_{22}$), from which the respective Petzval sum is established, differ from one another in a pairwise manner. Consequently, a first primary element focal length $f_{11}$ is selected for the first primary mirror 110.1, which differs from the second primary element focal length $f_{21}$ for the second primary mirror 113.1, such that, consequently, the following applies:

$$f_{11} \neq f_{21} \quad (9)$$

Naturally, the same then applies to the secondary element focal lengths $f_{12}$ and $f_{22}$ of the secondary mirrors 110.2 and 113.2, such that, consequently, the following applies:

$$f_{12} \neq f_{22}. \quad (10)$$

Furthermore, the first primary mirror 110.1 is arranged in such a way in the present example that, in the first operating state, the vertex $S_{11}$ thereof lies along the primary-side part of the optical axis 101.1, or along the axis of rotation 110.7 thereof, at a distance from the entrance pupil 111.1, the distance corresponding to the first primary element focal length $f_{11}$, while, in the second operating state, the same applies to the vertex S21 of the second primary mirror 113.1. Consequently, the second primary mirror 113.1 is therefore arranged in such a way in the present example that the vertex $S_{21}$ thereof lies along the primary-side part of the optical axis 101.1, or along the axis of rotation 113.7 thereof, at a distance from the entrance pupil 111.1 in the second operating state, the distance corresponding to the second primary element focal length $f_{12}$. Consequently, the focus F11 of the first primary mirror 110.1 or the focus F12 of the second primary mirror 113.1 respectively lies in a common plane 111.2 with the entrance pupil 111.1. What is achieved in an advantageous manner hereby is that the location and position of the exit pupil 112.1 remains unchanged (namely in the plane 111.2 of the entrance pupil 111.1) when interchanging the first optical element group 110 and the second optical element group 113, as a result of which the integration of the zoom unit 108 into the overall system 107 of the projection device 103 is further simplified.

The regions of the optical surfaces 110.3 and 110.4 of the first optical element group 110, which are used optically during imaging, are formed on carrier segments in the present example, which carrier segments are offset transverse to the axes 110.7 and 110.8 of the paraboloid first surfaces 110.5 and 110.6 and are held by a support structure 114 in each case. The same applies to the regions of the optical surfaces 113.3 and 113.4 of the second optical element group 113, which are used optically during imaging. As a result of this, corresponding passages for the light are formed in the imaging beam path.

Therefore, in the present example, for a shadow-free imaging beam path, there is a transverse offset between the light entrance side or primary side collimated entrance light beam (which is associated with the primary side first part of the optical axis 101.1 in the zoom unit 108) and the light exit side or secondary side collimated exit light beam (which is associated with the secondary side part of the optical axis 101.1 in the zoom unit 108). To this end, the respective primary mirror 110.1 and 113.1 and the associated secondary mirror 110.2 and 113.2 are then arranged with a transverse offset $Q_1$ and $Q_2$ (in view of the points of incidence of the primary side and secondary side parts of the optical axis 101.1) with respect to one another transverse to the primary side and secondary side parts of the optical axis 101.1.

In principle, the transverse offset $Q_1$ or $Q_2$ can be selected to have any size, wherein it is selected to be as small as possible in the interest of a compact arrangement and good imaging quality. Preferably, the transverse offset $Q_1$ or $Q_2$ is selected in such a way that, prior to passing through the exit pupil 112.2, the portion of the imaging light beam 103.1 passing through the entrance pupil 111.1 passes by the adjacent parts of the entrance pupil device 111 and/or of the exit pupil device 112 and/or of the optical elements without overlap or without shadowing at a distance, which is less than 5% to 20%, preferably 1% to 15%, more preferably 1% to 10%, of a diameter $D_E$ of the entrance pupil or a maximum diameter $D_E$ of the entrance light beam. In particular, in configurations with a particularly compact design, the transverse offset $Q_1$ or $Q_2$ can be 50% to 250%, preferably 75% to 200%, more preferably 90% to 150%, of the smallest vertex radius of curvature of the optical elements 110.1, 110.2, 113.1 and 113.2. In the present example, this smallest vertex radius of curvature is the vertex radius of curvature $r_{22}$ of the second secondary mirror 110.2.

Here, it is understood that, in the case of a (virtual) entrance pupil 111.1 and/or a (virtual) exit pupil 112.1, which is defined by an image of a unit (e.g. a stop or the like disposed upstream thereof) disposed upstream in the beam path of the first optical element group 110, it is only the portion of the imaging light beam 103.1 incident through the entrance pupil 111.1 that passes the entrance pupil 111.1 and/or the exit pupil 112.1 without an overlap at one of the aforementioned distances prior to passing through the exit pupil 112.2.

In principle, any suitable optical parameters can be selected for the respective primary mirrors 110.1 and 113.1 and the respective secondary mirrors 110.2 and 113.2, wherein the following applies for the respective paraboloid mirror with a focal length $f_{ij}$ and a vertex radius of curvature $r_{ij}$ at the vertex $S_{ij}$:

$$f_{ij} = \frac{r_{ij}}{2}. \quad (11)$$

In the present example, the first primary mirror 110.1 can have a first primary element vertex radius of curvature $r_{11}$=300 mm, while the first secondary mirror 110.2 has a first secondary element vertex radius of curvature $r_{12}$=150 mm. Therefore, in accordance with Equation (1), a first magnification scale $M_1$=0.5 emerges in the first operating state. Then, the second primary mirror 113.1 can have a second primary element vertex radius of curvature $r_{21}$=600 mm, while the second secondary mirror 110.2 has a second secondary element vertex radius of curvature $r_{22}$=120 mm. Therefore, in accordance with Equation (2), a second magnification scale $M_2$=0.2 emerges in the second operating state.

In other variants, the first primary element vertex radius of curvature $r_{11}$ can be 50 mm to 1500 mm, preferably 100 mm to 1000 mm, more preferably 200 mm to 800 mm, while the first secondary element vertex radius of curvature $r_{12}$ can be 50 mm to 1500 mm, preferably 100 mm to 1000 mm, more preferably 200 mm to 800 mm. Additionally or alternatively, the second primary element vertex radius of curvature $r_{21}$ can be 50 mm to 1500 mm, preferably 100 mm to 1000 mm, more preferably 200 mm to 800 mm, while the second secondary element vertex radius of curvature $r_{22}$ can be 50 mm to 1500 mm, preferably 100 mm to 1000 mm, more preferably 200 mm to 800 mm. Using these parameter values, it is possible to obtain particularly advantageous configurations in each case, in particular particularly compact configurations with an advantageous variation of the magnification scale.

The optical elements, the respective primary mirrors 110.1 and 113.1 and the respective secondary mirrors 110.2 and 113.2, are in each case provided with concave optical surfaces 110.3 or 113.3 and 110.4 or 113.4 in the present example. However, in certain variants, it is also possible, where desired, to use one or more convex optical surfaces (i.e. optical surfaces with negative refractive power or negative focal length $f_{ij}$). By way of example, use can therefore be made of at least one of the secondary mirrors 110.2 and 113.2 with a convex optical surface 110.4 or 113.4 (i.e. $f_{12}<0$ or $f_{22}<0$). As a result of this, spatially particularly compact configurations can be obtained.

The interchange of the first optical element group 110 and the second optical element group 113 involved for adjusting the magnification scale can, as a matter of principle, be carried out in any way. In the present example, the mirrors 110.1, 110.2 of the first optical element group 110 and the mirrors 113.1, 113.2 of the second optical element group 113 are mounted on the support structure 114 in a manner rotated by 90° with respect to an axis 114.1 of the support structure 114. In order to adjust the magnification scale, the optical element group 110 and the second optical element group 113 can then easily be moved out of, or into, the imaging beam path under simultaneous movement by virtue of the support structure 114 being swiveled through 90° about the swivel axis 114.1 in the appropriate direction by way of an appropriate drive. As a result, a particularly simple and quick interchange or a particularly simple and quick adjustment of the magnification scale is possible.

Figure 5:
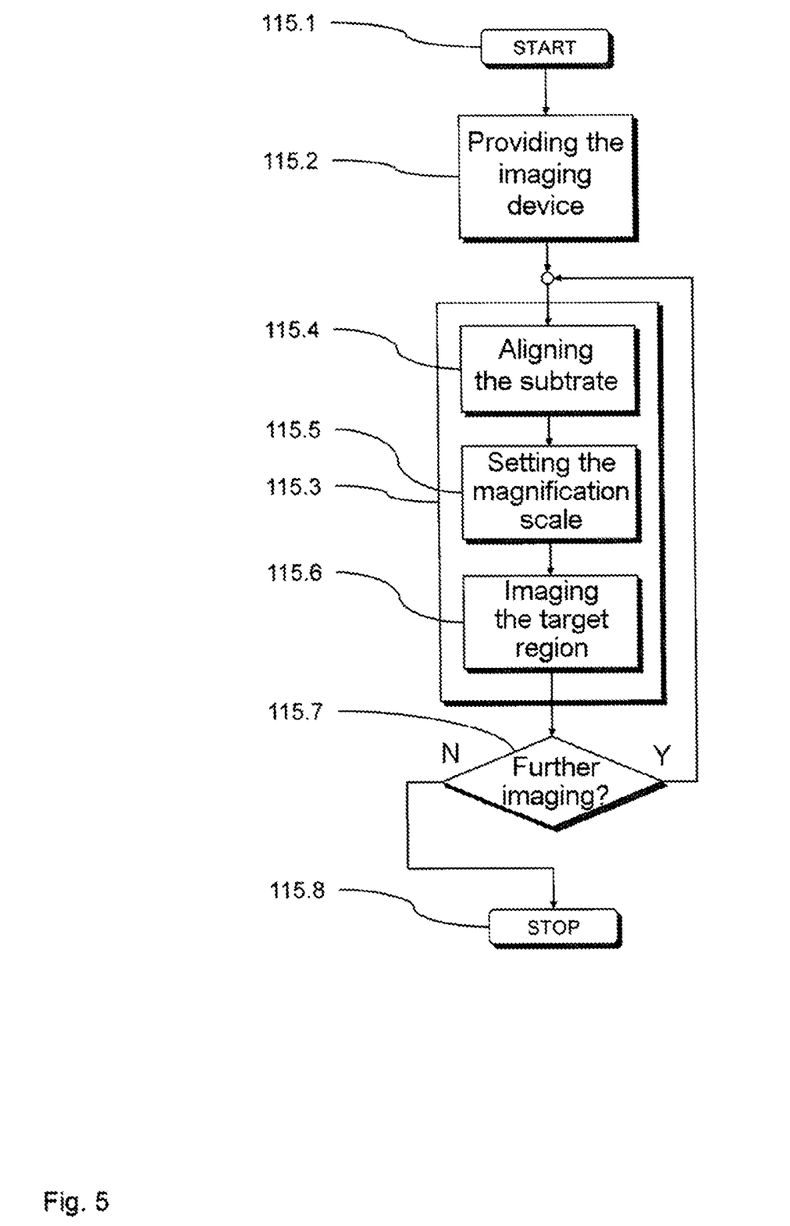
FIG. 5 is a flowchart of a preferred embodiment of the optical imaging method according to the disclosure, in which a preferred embodiment of the method according to the disclosure for adjusting the magnification scale of the optical imaging device from FIG. 1 is used.

FIG. 5 shows a flowchart of a preferred variant of an imaging method according to the disclosure, which is carried out by the inspection device 101 using a preferred variant of a zoom method according to the disclosure.

Initially, the method sequence starts in a step 115.1. Then, the components of the inspection device 101 are provided and positioned in the way described above in a step 115.2

Then, a target region of the mask 104.1 is imaged in a step 115.3. To this end, the mask 104.1 is initially positioned in a step 115.4. Then, where desired, the magnification scale $M_1$ or $M_2$ for the respective imaging is set in the zoom unit 108 in the manner described above in a step 115.5 by interchanging the first optical element group 110 and the second optical element group 113. Then, the target region of the mask 104.1 is imaged in a step 115.6 by virtue of the mask being illuminated by the imaging light beam by way of the illumination device 102 and the corresponding regions of the surface of the mask 104.1 then being imaged via the projection device 103 onto the sensor surface of the image sensor 105.1, as was described above.

Then, a check is carried out in a step 115.7 as to whether a further imaging sequence should take place. In the affirmative, there is a jump back to the step 115.3. Otherwise, the method sequence is terminated in a step 115.8.

Above, the present disclosure was only described on the basis of an example from the field of mask inspection for microlithography, wherein this mask inspection may take place at substantially the same wavelength that is used in the subsequent microlithography process. However, it is likewise possible also to use any wavelengths deviating therefrom for the inspection.

However, it is understood that the disclosure can also be used in the context of any other optical applications, in particular imaging methods at other wavelengths. The disclosure can thus be used in the context of inspecting objects, such as e.g. the so-called wafer inspection, in which the structures generated by microlithography (e.g. circuits or the like) are examined on the wafer in respect of the integrity, etc. thereof.

However, it itself can likewise also be used for exposing a substrate, such as e.g. a wafer. Then, the sensor unit 105.1 is replaced in FIG. 1 by e.g. such a substrate, on which the projection pattern of the mask 104.1 is imaged.

Finally, the present disclosure was described above on the basis of concrete exemplary embodiments, which show concrete combinations of the features defined in the following patent claims. It is explicitly noted at this point that the subject matter of the present disclosure is not restricted to this combination of features but that the subject matter of the present disclosure also includes all other combinations of features, as emerge from the subsequent patent claims.

What is claimed is:

1. A method of adjusting a magnification scale of an optical imaging device, the optical imaging device comprising a first optical element group consisting of two reflecting optical elements in an imaging beam path of light having a wavelength of less than 200 nm, the optical imaging device further comprising a second optical element group consisting of two reflecting optical elements, the method comprising:

adjustment of the magnification scale of the optical imaging device consists of:
removing the two reflective optical elements of the first optical element group from the imaging beam path; and
moving the two reflective optical elements of the second optical element group into the imaging beam path,
wherein:
the two reflecting optical elements of the first optical element group have first optical parameters defining a first Petzval sum;
the two reflecting optical elements of the second optical element group have second optical parameters defining a second Petzval sum; and
a value of the first Petzval sum is at least substantially identical to a value of the second Petzval sum.

2. The method of claim 1, wherein at least one member selected from the group consisting of the first optical element group and the second optical element group comprises an afocal optical element group.

3. The method of claim 1, wherein at least one member selected from the group consisting of the first optical element group and the second optical element group comprises an anastigmatic optical element group.

4. The method of claim 1, wherein at least one member selected from the group consisting of the first optical element group and the second optical element group comprises an aplanatic optical element group.

5. The method of claim 1, wherein the two reflecting optical elements of the first optical element group comprise at least substantially confocal and at least substantially paraboloid optical surfaces which lie on paraboloid surfaces arranged in a substantially coaxial manner.

6. The method of claim 5, wherein the at least substantially confocal and at least substantially paraboloid optical surfaces of the first optical element group comprise segments offset transverse to axes of the paraboloid surfaces which are arranged in a substantially coaxial manner.

7. The method of claim 5, wherein the two reflecting optical elements of the second optical element group comprise at least substantially confocal and at least substantially paraboloid optical surfaces which lie on paraboloid surfaces arranged in a substantially coaxial manner.

8. The method of claim 7, wherein the at least substantially confocal and at least substantially paraboloid optical surfaces of the second optical element group comprise segments offset transverse to axes of the paraboloid surfaces which are arranged in a substantially coaxial manner.

9. The method of claim 7, wherein:
the two reflecting optical elements of the first optical element group consisting of a first primary element with a first primary element focal length $f_{11}$ and a first secondary element with a first secondary element focal length $f_{12}$;
the two reflecting optical elements of the second optical element group consisting of a second primary element with a second primary element focal length $f_{21}$ and a second secondary element with a second secondary element focal length $f_{22}$;
$M_1$ is a first imaging scale;
$M_2$ is a second magnification scale;

$$M_1 = \frac{f_{12}}{f_{11}};$$

$$M_2 = \frac{f_{22}}{f_{21}};$$

$$f_{21} = f_{11} \cdot \frac{M_1 \cdot (M_2 + 1)}{M_2 \cdot (M_1 + 1)}; \text{ and}$$

$$f_{22} = f_{11} \cdot \frac{M_1 \cdot (M_2 + 1)}{(M_1 + 1)}.$$

10. The method of claim 1, wherein the two reflecting optical elements of the second optical element group comprise at least substantially confocal and at least substantially paraboloid optical surfaces which lie on paraboloid surfaces arranged in a substantially coaxial manner.

11. The method of claim 10, wherein the at least substantially confocal and at least substantially paraboloid optical surfaces of the second optical element group comprise segments offset transverse to axes of the paraboloid surfaces which are arranged in a substantially coaxial manner.

12. The method of claim 1, wherein at least one of the following holds:
one of the two reflecting optical elements of the first optical element group comprises a first primary element comprising a first primary element vertex radius of curvature which is from 50 mm to 1500 mm;
one of the two reflecting optical elements of the first optical element group comprises a first secondary element comprising a first secondary element vertex radius of curvature which is from 50 mm to 1500 mm;
one of the two reflecting optical elements of the second optical element group comprises a second primary element comprising a second primary element vertex radius of curvature which is from 50 mm to 1500 mm; and/or
one of the two reflecting optical elements of the second optical element group comprises a second secondary element comprising a second secondary element vertex radius of which is from 50 mm to 1500 mm.

13. The method of claim 1, wherein:
an entrance pupil is defined on a light entrance side of at least one member selected from the group consisting of the first optical element group and the second optical element group; and
at least one of the following holds:
one of the two reflecting optical elements of the first optical element group comprises a first primary element configured so that a vertex of the first primary element lies a distance from the entrance pupil along an optical axis of the imaging device, the distance corresponding at least substantially to a focal length of the first primary element; and/or
one of the two reflecting optical elements of the first optical element group comprises a second primary element configured so that a vertex of the second primary element lies at a distance from the entrance pupil along the optical axis of the imaging device, the distance corresponding at least substantially to a focal length of the second primary element.

14. The method of claim 1, wherein:
an entrance pupil for an entrance light beam is defined on a light entrance side of at least one member selected from the group consisting of the first optical element group and the second optical element group, the entrance light beam being associated with a first part of an optical axis of the imaging device, the first part being incident on a primary element of at least one member selected from the group consisting of the first optical element group;
an exit pupil for an exit light beam is defined on a light exit side of at least one member selected from the group consisting of the first optical element group and the second optical element group, the exit light beam being associated with a second part of the optical axis of the imaging device, the second part emanating from a secondary element of at least one member selected from the group consisting of the first optical element group;
the primary element and the associated secondary element are transverse to the first part of the optical axis with a transverse offset in relation to each other;
the transverse offset is configured so that, prior to passing through the exit pupil, the portion of the imaging light beam passing through the entrance pupil passes by the entrance pupil and/or the exit pupil and/or the optical elements without shadowing at a distance which is less 20% of a diameter of the entrance pupil or a maximum diameter of the entrance light beam; and
the transverse offset is 75% to 200% of a smallest vertex radius of curvature of the optical elements in the first and second optical element groups.

15. The method of claim 1, wherein at least one of the following holds:
at least one member selected from the group consisting of the two reflecting optical elements the first optical element group and the two reflecting optical elements of the second optical element group has a concave optical surface; and/or
at least one member selected from the group consisting of the two reflecting optical elements the first optical element group and the two reflecting optical elements the second optical element group has a convex optical surface.

16. The method of claim 1, wherein:
adjusting the magnification scale comprises moving at least one of the two reflecting optical elements of the first optical element group together with at least one the two reflecting optical elements of the second optical element group; and
the at least one of the two reflecting optical elements of the first optical element group is arranged with the at least one of the two reflecting optical elements of the second optical element group on a common carrier device.

17. The method of claim 1, wherein:
the optical imaging device comprises an illumination device and a projection device; and
the method further comprises:
using the illumination device to illuminate an object; and
using a projection device to generate an image of the object on an image device while adjusting the magnification scale of the optical imaging device.

18. An optical imaging unit, comprising:
a first optical element group consisting of two reflecting optical elements arranged in an imaging beam path of radiation having a wavelength of less than 200 nm;
a second optical element group consisting of two reflecting optical elements; and
a support structure supporting the first optical elements, wherein:
the optical imaging unit is configured so that, normal operation of the imaging unit, the magnification scale of the optical imaging unit adjustment consists of:
removing the two reflecting optical elements of the first optical element group are in from the imaging beam path; and
moving the two reflecting optical elements of the second optical element group into the imaging beam path;
the two reflecting optical elements of the first optical element group have first optical parameters defining a first Petzval sum;
the two reflecting optical elements of the second optical element group have second optical parameters defining a second Petzval sum; and
a value of the first Petzval sum is at least substantially identical to a value of the second Petzval sum.

19. The optical imaging unit of claim 18, wherein at least one of the following holds:
at least one member of the group consisting of the first optical element group and the second optical element group comprises an afocal optical element group;
at least one member of the group consisting of the first optical element group and the second optical element group comprises anastigmatic optical element group; and
at least one member of the group consisting of the first optical element group and the second optical element group comprises an aplanatic optical element group;
the two reflecting optical elements of the first optical element group comprise at least substantially confocal and at least substantially paraboloid optical surfaces which lie on paraboloid first surfaces arranged in a substantially coaxial manner;
the two reflecting optical elements of the second optical element group comprise at least substantially confocal and at least substantially paraboloid optical surfaces which lie on paraboloid second surfaces arranged in a substantially coaxial manner;
at least one of the optical elements of a member selected from the group consisting of the first optical element group and the second optical element group is an optical element comprising a concave optical surface; and/or
at least one of the optical elements of a member selected from the group consisting of the first optical element group and the second optical element group is an optical element comprising a convex optical surface.

20. The optical imaging unit of claim 18, wherein:
an entrance pupil unit defining an entry pupil is on a light entrance side of at least member selected from the group consisting of the first optical element group and the second optical element group;
and at least one of the following holds:
one of the two reflecting optical elements of the first optical element group comprises a first primary element configured so that, in a first operating state, a vertex of the first primary element is a first distance from the entrance pupil along an optical axis of the imaging device, the first distance corresponding at least substantially to a focal length of the first primary element;
one of the two reflecting optical elements of the second optical element group comprises a second primary element configured so that, in a second operating state, a vertex of the second primary element is a second distance from the entrance pupil along the optical axis of the imaging device, the second distance corresponding at least substantially to a focal length of the second primary element; and/or
the entrance pupil unit defines an entrance pupil for an entrance light beam on the light entrance side of a member selected from the group consisting of the first optical element group and the second optical element group, the light entrance light beam being associated with a first part of the optical axis of the imaging device, the first part being incident on a primary element of a member selected from the group consisting of the first optical element group and the second optical element group, an exit pupil unit being provided on the light exit side of a member selected from the group consisting of the first optical element group and the second optical element group, the exit pupil unit defining an exit pupil for an exit light beam, the exit light beam being associated with a second part of the optical axis of the imaging device, the second part emanating from a secondary element of a member selected from the group consisting of the first optical element group and the second optical element group, the primary and secondary elements being transverse to the first part of the optical axis with a transverse offset in relation to each other.

21. The optical imaging unit of claim 18, wherein:
at least one of the reflecting optical elements of the first optical element group is configured to be moved together with at least one of the reflecting optical elements of the second optical element group to adjust the magnification scale; and
the carrier device supports the at least one of the reflecting optical elements of the first optical element group and the at least one of the reflecting optical elements of the second optical element group.

22. An optical imaging device, comprising:
an illumination device configured to illuminate an object; and
a projection device configured to project an image of the object onto an image device,
wherein the projection device comprises the optical imaging unit according to claim 18.

* * * * *

UNITED STATES PATENT AND TRADEMARK OFFICE
CERTIFICATE OF CORRECTION

| | |
|---|---|
| PATENT NO. | : 10,678,033 B2 |
| APPLICATION NO. | : 15/630077 |
| DATED | : June 9, 2020 |
| INVENTOR(S) | : Holger Muenz |

It is certified that error appears in the above-identified patent and that said Letters Patent is hereby corrected as shown below:

In the Drawings

Please replace Fig. 5 with Fig. 5 as shown on the attached page;

In the Specification

Column 7, Line 47, delete "swiveling" and insert -- swivelling --;

Column 12, Line 44, below "(5):" insert -- $P_1=P_2$. --;

Column 13, Line 29, delete "S21" and insert -- $S_{21}$ --;

Column 15, Line 46, delete "115.2" and insert -- 115.2. --;

In the Claims

Column 19, Line 37, Claim 18, after "are" delete "in".

Signed and Sealed this
Eighteenth Day of August, 2020

Andrei Iancu
*Director of the United States Patent and Trademark Office*

Fig. 5